United States Patent

Frank et al.

[15] 3,645,730

[45] Feb. 29, 1972

[54] REPRODUCTION OF IMAGES USING LIGHT SENSITIVE CURABLE LIQUID POLYMERS

[72] Inventors: Victor S. Frank, Silver Spring; Donald P. Gush, Hyattsville, both of Md.

[73] Assignee: W. R. Grace & Co., New York, N.Y.

[22] Filed: Oct. 11, 1968

[21] Appl. No.: 766,949

[52] U.S. Cl. .......................................96/28, 96/35.1, 96/67, 96/85, 96/87 R, 96/115 P

[51] Int. Cl. ..........................................................G03c 1/68

[58] Field of Search ............................96/28, 35.1, 36.3, 115

[56] References Cited

UNITED STATES PATENTS

| | | | |
|---|---|---|---|
| 3,453,110 | 7/1969 | Delzenne et al. | 96/36.4 |
| 3,055,758 | 9/1962 | McDonald | 96/48 |
| 3,060,026 | 10/1962 | Heiart | 96/28 |
| 3,342,593 | 9/1967 | Burg | 96/28 |
| 3,145,104 | 8/1964 | Oster et al. | 96/36.3 |
| 3,306,745 | 2/1967 | Webers | 96/35.1 |
| 3,427,161 | 2/1969 | Lartdon et al. | 96/36.3 |

*Primary Examiner*—William D. Martin
*Assistant Examiner*—M. Sofocleous
*Attorney*—Kenneth E. Prince

[57] ABSTRACT

Reproduction of printed or other images from a negative or positive master on a paper or transparency is possible using a laminated element containing a photocurable liquid polymer. A dry process is disclosed for preparing transparent positive and negative images in a single image exposure. The imagewise exposure is through a stencil, or a negative or positive transparency (halftone or line). The process, for example, includes placing a photocurable liquid polymer layer between two sheets, at least one of which is transparent, exposing the laminate to actinic or UV radiation through a negative image, and separating the sheets. Depending upon the system, a positive image is formed on the sheet proximate the light source and a negative image on the other sheet, or vice versa. The two sheets have different adhesive forces for cured and uncured photoadhesive compositions, which accounts for the adhesion of the cured and uncured to different sheets. The photocurable liquid polymer composition consists essentially of an ethylenically unsaturated polyene containing at least two reactive carbon to carbon bonds per molecule, a polythiol containing at least two thiol groups per molecule, a photocuring rate accelerator and black, white or colored fillers, pigments or dyes.

32 Claims, No Drawings

REPRODUCTION OF IMAGES USING LIGHT SENSITIVE CURABLE LIQUID POLYMERS

BACKGROUND OF THE INVENTION

1. Objectives of the Invention

It is an object of this invention to provide a new and more practical process for forming images by photocure. Another object is to provide a process for forming both positive and negative images on separate supports at room temperature from one image exposure and one delaminating operating, said images being clear and sharp and having good resolution and uniform density. A further object of this invention is to provide a photoadhesive process for forming from laminated structures photocured images having superior halftone reproduction capability and fidelity. An even further object is to provide a process of forming photocured images having good dimensional stability and low background stain. A yet further object is to provide a process which requires a minimum of mechanical image development apparatus. It is also an object to provide an article of manufacture which is prepared by the above-described processes and possesses the above-mentioned properties and structure.

2. Prior Art

Various processes for producing copies of an image by photopolymerization and thermal transfer are known, but they are limited in the scope of their application. For example, because the transfer elements of the prior art depend on high temperatures to soften the composition to its stick temperature, special equipment is required. Heated pressure rollers are required to effect transfer of the unexposed polymerizable material which forms the image complementary to that formed by the dimensional fidelity of reproduced images relative to the original because of temperature changes. Photopolymerizable processes, such as, the one described in U.S. Pat. No 3,353,955, generally cannot produce an element containing an image having satisfactory halftone capability and fidelity. Further, these compositions are subject to inhibition in the presence of traces of oxygen from the air and reproduction performance is not always reliable.

BROAD DESCRIPTION OF THE INVENTION

The process of this invention broadly includes exposing imagewise with UV radiation and then separating by peeling at room temperature, a laminated photocurable element comprising two supports having different adhesive forces for cured and uncured photocurable compositions, said supports having laminated therebetween a thin stratum of a photocurable composition. The photocurable element is exposed until substantially complete curing takes place in the exposed areas. Substantially, no photocuring takes place in the unexposed areas. The imagewise exposure is through a stencil, or a positive or negative transparency (halftone or line).

DETAILED DESCRIPTION OF THE INVENTION

The crucial ingredients in the photocurable composition are:

1. about 2 to about 98 parts by weight of an ethylenically unsaturated polyene containing two or more reactive unsaturated carbon to carbon bonds;
2. about 98 to about 2 parts by weight of a polythiol; and
3. about 0.0005 to about 50 parts by weight [based on 100 parts by weight of (1) and (2)] of a photocuring rate accelerator. (Preferred range of accelerator is about 0.05 to about 30 parts by weight.)

The reactive carbon to carbon bonds of the polyenes are preferably located terminally, near terminally, and/or pendant from the main chain. The polythiols, preferably, contain two or more thiol groups per molecule. These photocurable compositions are usually, and preferably, liquid at room temperatures, although the compositions can be solid, crystalline, semisolid, etc., at those temperature, but which are liquid at 70°C.

Included in the term "liquid," as used herein, are those photocurable compositions which in the presence of inert solvent, aqueous dispersion or plasticizer have a viscosity ranging from essentially zero to 20 million centipoises at 70° C.

As used herein polyenes and polyynes refer to simple or complex species of alkenes or alkynes having a multiplicity, i.e., at least 2, "reactive" carbon to carbon unsaturated functional groups per average molecule. For example, a diene is a polyene that has two "reactive" carbon to carbon double bonds per average molecule, while a diyne is a polyyne that contains in its structure two "reactive" carbon to carbon triple bonds per average molecule. Combinations of "reactive" double bonds and "reactive" triple bonds within the same molecule are also operable. An example of this is monovinylacetylene, which is a polyeneyne under our definition. For purposes of brevity all these classes of compounds will be referred to herein as polyenes.

As used herein the term "reactive" unsaturated carbon to carbon groups means groups which will react under proper conditions as set forth herein with thiol groups to yield the thioether linkage $$(-\overset{|}{\underset{|}{C}}-S-\overset{|}{\underset{|}{C}}-),$$

, as contrasted to the term "unreactive" carbon to carbon unsaturation which means $$-\overset{|}{C}=\overset{|}{C}-$$

groups when found in aromatic nucleii (cyclic structures exemplified by benzene, pyridine, anthracene, tropolone and the like) which do not under the same conditions react with thiols to give thioether linkages. In the instant invention products from the reaction of polyenes with polythiols which contain two or more thiol groups per average molecule are called polythioether polymers or polythioethers.

One group of polyenes operable in the instant invention is that taught in a copending application having Ser. No. 617,801, inventors: Kehr and Wszolek, filed: Feb. 23, 1967, and assigned to the same assignee, and now abandoned. This group includes those having a molecular weight in the range of about 50 to 20,000, a viscosity ranging from 0 to 20 million centipoises at 70° C. of the general formula: $[A]-(X)_m$ wherein X is a member of the group consisting of $$R-\overset{R}{\overset{|}{C}}=\overset{R}{\overset{|}{C}}-$$

and R—C≡C—; m is at least 2; R is independently selected from the group consisting of hydrogen, halogen, aryl, substituted aryl, cycloalkyl, substituted cycloalkyl, aralkyl, substituted aralkyl and alkyl and substituted alkyl groups containing 1 to 16 carbon atoms and A is a polyvalent organic moiety free of (1) reactive carbon to carbon unsaturation and (2) unsaturated groups in conjugation with the reactive ene or yne groups in X. Thus A may contain cyclic groupings and minor amounts of hetero atoms such as N, S, P or O but contains primarily carbon-carbon, carbon-oxygen or silicon-oxygen containing chain linkages without any reactive carbon to carbon unsaturation.

In this first group, the polyenes are simple or complex species of alkenes or alkynes having a multiplicity of pendant, terminally or near terminally positioned "reactive" carbon to carbon unsaturated functional groups per average molecule. As used herein for determining the position of the reactive functional carbon to carbon unsaturation, the term "terminal" means that said functional unsaturation is at an end of the main chain in the molecule; whereas by "near terminal" is meant that the functional unsaturation is not more than 16 carbon atoms away from an end of the main chain in the molecule. The term "pendant" means that the reactive carbon to carbon unsaturation is located terminally or near terminally in a branch of the main chain as contrasted to a position at or near the ends of the main chain. For purposes of brevity all of these positions will be referred to generally as "terminal" unsaturation.

The liquid polyenes operable in this first group contain one or more of the following types of nonaromatic and nonconjugated "reactive" carbon to carbon unsaturation:

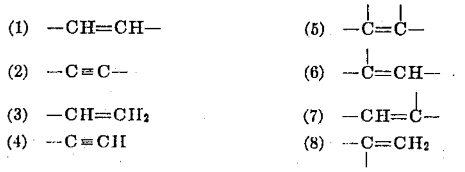

These functional groups as shown in 1–8 supra are situated in a position either which is pendant, terminal or near terminal with respect to the main chain but are free of terminal conjugation. As used herein the phrase "free of terminal conjugation" means that the terminal "reactive" unsaturated groupings may not be linked directly to nonreactive unsaturated species such as

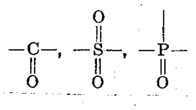

and the like so as to form a conjugated system of unsaturated bonds exemplified by the following structure:

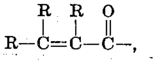

, etc. On the average the polyenes must contain 2 or more "reactive" unsaturated carbon to carbon bonds/molecule and have a viscosity in the range from slightly above 0 to about 20 million centipoises at 70° C. Included in the term "polyenes" as used herein are those materials which in the presence of an inert solvent, aqueous dispersion or plasticizer fall within the viscosity range set out above at 70° C. Operable polyenes in the instant invention have molecular weights in the range of about 50 to about 20,000, preferably about 500 to about 10,000.

Examples of operable polyenes from this first group include, but are not limited to:

1. crotyl-terminated polyurethanes which contain two "reactive" double bonds per average molecule in a near terminal position of the average general formula:

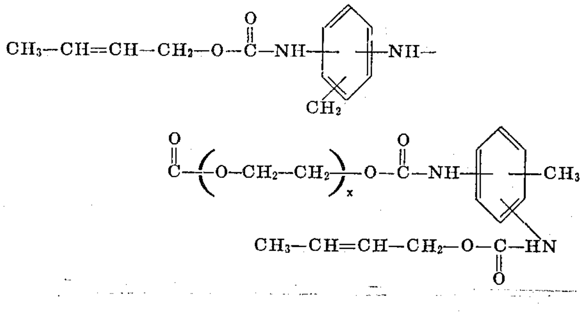

wherein $x$ is at least 1, 2. ethylene/propylene/non-conjugated diene terpolymers, such as "Nordel 1040" manufactured by E. I. duPont de Nemours & Co., Inc., which contains pendant "reactive" double bonds of the formula: $—CH_2—CH\ \ CH—CH_3$,
3. The following structure which contains terminal "reactive" double bonds:

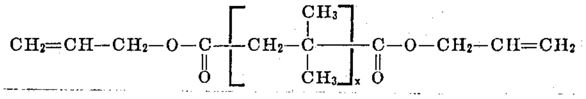

where $x$ is at least 1.

4. The following structure which contains near terminal "reactive" double bonds

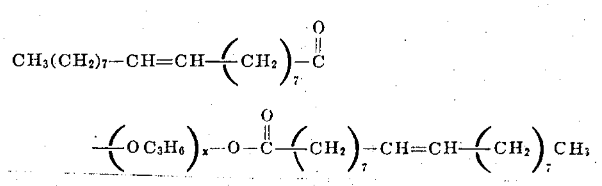

where $x$ is at least 1.

Another group of operable polyenes includes those unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber and the like; unsaturated polyesters, polyamides, and polyurethanes derived from monomers containing "reactive" unsaturation, e.g., adipic acid-butenediol, 1,6-hexanediamine-fumaric acid and 2,4-tolylene diisocyanate-butenediol condensation polymers and the like.

A third group of polyenes operable in this invention include those polyenes in which the reactive unsaturated carbon to carbon bonds are conjugated with adjacent unsaturated groupings. Examples of operable conjugated reactive ene systems include but are not limited to the following:

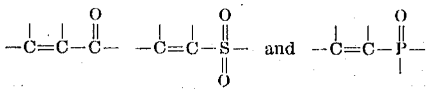

A few typical examples of polymeric polyenes which contain conjugated reactive double bond groupings such as those described above are poly (oxyethylene) glycol (600 M.W.) diacrylate, poly (oxytetramethylene) glycol (1,000 M.W.) dimethacrylate, the triacrylate of the reaction product of trimethylol propane with 20 moles of ethylene oxide, and the like.

Methods of preparing various polyenes useful within the scope of this invention are disclosed in a copending application having Ser. No. 674,773 filed: Oct. 12, 1967, and assigned to the same assignee now abandoned. Some of the useful polyenes are prepared in the detailed examples, set forth in the following specification.

As used herein, the term polythiols refers to simple or complex organic compounds having a multiplicity of pendant or terminally positioned —SH functional groups per average molecule.

On the average the polythiols must contain 2 or more —SH groups/molecule. They usually have a viscosity range of slightly above 0 to about 20 million centipoises (c.p.s.) at 70° C., as measured by a Brookfield Viscometer. Included in the term "polythiols" as used herein are those materials which in the presence of an inert solvent, aqueous dispersion or plasticizer fall within the viscosity range set out above 70° C. Operable polythiols in the instant invention usually have molecular weights in the range about 50 to about 20,000 or more, preferably about 100 to about 10,000.

The polythiols operable in the instant invention can be exemplified by the general formula: $R_8—(SH)_n$ where $n$ is at least 2 and $R_8$ is a polyvalent organic moiety free from "reactive" carbon to carbon unsaturation. Thus $R_8$ may contain cyclic groupings and minor amounts of hetero atoms such as N, S, P or O but primarily contains carbon-hydrogen, carbon-oxygen, or silicon-oxygen containing chain linkages free of any "reactive" carbon to carbon unsaturation.

One class of polythiols operable with polyenes in the instant invention to obtain essentially odorless cured polythioether printing plates are esters of thiol-containing acids of the general formula: HS—$R_9$—COOH where $R_9$ is an organic moiety containing no "reactive" carbon to carbon unsaturation with polyhydroxy compounds of the general structure: $R_{10}$—$(OH)_n$ where $R_{10}$ is an organic moiety containing no "reactive" carbon to carbon unsaturation and *n* is 2 or greater. These components will react under suitable conditions to give a polythiol having the general structure:

$$R_{10}\left(O\overset{O}{\overset{\|}{C}}-R_9-SH\right)_n$$

where $R_9$ and $R_{10}$ are organic moieties containing no "reactive" carbon to carbon unsaturation and *n* is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as a thiol-terminated ethylcyclohexyl dimercaptan polymer, etc., and similar polythiols which are conveniently and ordinarily synthesized on a commercial basis, although having obnoxious odors, are operable in this invention. Examples of the polythiol compounds preferred for this invention because of their relatively low odor level and fast curing rate include but are not limited to esters of thioglycolic acid (HS—$CH_2$COOH), α-mercaptopropionic acid (HS—CH($CH_3$)—COOH and β-mercaptopropionic acid (HS—$CH_2CH_2$COOH) with polyhydroxy compounds such as glycols, triols, tetraols, pentaols, hexaols, etc. Specific examples of the preferred polythiols include but are not limited to ethylene glycol bis(thioglycolate), ethylene glycol bis(β-mercaptopripionate), trimethylolpropane tris(thioglycolate), trimethylolpropane tris(β-mercaptopropionate), pentaerythritol tetrakis (thioglycolate) and pentaerythritol tetrakis (β-mercaptopropionate), all of which are commercially available. A specific example of a preferred polymeric polythiol is polypropylene ether glycol bis(β-mercaptopropionate) which is prepared from polypropylene-ether glycol (e.g., Pluracol P2010, Wyandotte Chemical Corp.) and β-mercaptopropionic acid by esterification.

The preferred polythiol compounds are characterized by a low level of mercaptanlike odor initially, and after reaction, give essentially odorless cured polythioether end products which are commercially useful resins or elastomers for printing plates.

As used herein the t term "odorless" means the substantial absence of well-known offensive and sometimes obnoxious odors that are characteristic of hydrogen sulfide and the derivative family of compounds known are mercaptans.

The term "functionality" as used herein refers to the average number of ene or thiol groups per molecule in the polyene or polythiol, respectively. For example, a triene is a polyene with an average of three "reactive" carbon to carbon unsaturated groups per molecule and thus has a functionality (*f*) of three. A polymeric dithiol is a polythiol with an average of two thiol groups per molecule and thus has a functionally (*f*) of two.

It is further understood and implied in the above definitions that is these systems, the functionality of the polyene and the polythiol component is commonly expressed in whole numbers although in practice the actual functionality may be fractional. For example, a polyene component having a nominal functionality of 2 (from theoretical considerations alone) may in fact have an effective functionality of somewhat less than 2. In an attempted synthesis of a diene from a glycol in which the reaction proceeds to 100 percent of the theoretical value for complete reaction, the functionality (assuming 100 percent pure starting materials) would be 2.0. If, however, the reaction were carried to only 95 percent of theory for complete reaction, about 10 percent of the molecules present would have only one ene functional group, and there may be a trace of material that would have no ene functional groups at all. Approximately 90 percent of the molecules, however, would have the desired diene structure and the product as a whole then would have an actual functionality of 1.9. Such a product is useful in the instant invention and is referred to herein as having a functionality of 2.

The aforesaid polyenes and polythiols can, if desired, be formed or generated in situ and still fall within the scope of the instant invention.

To obtain the maximum strength, solvent resistance, creep resistance, heat resistance and freedom from tackiness, the reaction components consisting of the polyenes and polythiols of this invention generally are formulated in such a manner as to give solid, cross-linked, three-dimensional network polythioether polymer systems on curing. In order to achieve such infinite network formation the individual polyenes and polythiols must each have a functionality of at least 2 and the sum of the functionalities of the polyene and polythiol components must always be greater than 4. Blends and mixtures of the polyenes and the polythiols containing said functionality are also operable herein.

In general, it is preferred, especially at or near the operable lower limits of functionality in the polyene and polythiol, to use the polythiol and the polyene compounds in such amounts that there is one thiol group present for each double bond, it being understood that the total functionality of the system must be greater than four, and the functionality of the thiol and the diene must each be at least two. For example, if two moles of a triene are used, and a dithiol is used as the curing agent, making the total functionality have a value of five, it is preferable to use three moles of the dithiol. If much less than this amount of the thiol is used, the curing rate will be lower and the product will be weaker because of the reduced cross-link density. If much more than the stoichiometric amount of the thiol is used, the rate of cure may be higher, if that is desirable, although excessive amounts can lead to a plasticized cross-linked product which may not have the desired properties. However, it is within the scope of this invention to adjust the relative amounts of polyenes and polythiols to any values above the minimum scope disclosed herein which give desirable properties to the cross-linked polythioether.

The photocuring reaction can be initiated by UV radiation contained in actinic radiation from sunlight or obtained from special light sources which emit significant amounts of UV light. Thus it is possible merely to expose the polyene and polythiol admixture to actinic radiation under ambient conditions or otherwise and obtain a cured solid elastomeric or resinous product useful as image production material. But this approach to the problem results in extremely long exposure times which causes the process in the vast bulk of applications to be commercially unfeasible. Chemical photocuring rate accelerators (photoinitiators or sensitizers of activators) serve to drastically reduce the imaging exposure times and thereby when used in conjunction with various forms of energetic radiation (containing UV radiation) yield very rapid, commercially practical cures by the practice of the instant invention. Useful photocuring rate accelerators include benzophenone, acetophenone, acenapthene-quionone, methyl ethyl ketone, thioxanthen-9-one, xanthen-9-one, 7-H-Benz [de] anthracen-7-one, dibenzosuberone, 1-naphthaldehyde, 4,4'-bis-(dimethylamino) benzophenone, fluorene-9-one, 1'-acetonaphthone, 2'-acetonaphthone, 2,3-butanedione, anthraquinone, 1-indanone, 2-tert -butyl anthraquinone, calerophenone, hexanophenone, 8-phenylbutyrophenone, p-mor pholinopropiophenone, 4-morpholinobenzophenone, 4'-morpholinoseoxybenzoin, p-diacetylbenzene, 4-aminobenzophenone, 4'-methoxyacetophenone, benzaldehyde, α-tetralone, 9-acetylphenanthrene, 2-acetylphenanthrene, 10-thioxanthenone, 3-acetylphenanthrene, 3-acetylindole, 1,3,5-triacetylbenzene, etc., and blends thereof. The photocuring rate accelerators (the third crucial ingredient) added in an amount ranging from about 0.0005 to about 10 percent by weight of the polyene and polythiol components in the instant invention. Benzophenone is the preferred photocuring rate accelerator. Useful UV radiation has a wave length in the range of about 2,000 to 4,000 angstrom units.

The photocurable composition is characterized in that in its cured state at room temperature, it has greater adhesion for one support than the other and in its uncured state, it has greater adhesion for the second support than for the first. The photocurable stratum is further characterized in that it is normally and preferably a viscous liquid or thixotropic paste or a weak waxlike semisolid at room temperatures in its uncured state; and is a tough, high molecular weight solid at all normally encountered temperatures in its cured state. In other words, if $A_1$ and $A_2$ represent the adhesive strengths of the uncured stratum to supports 1 and 2 and $A'_1$ and $A'_2$ represent the adhesive strengths of the stratum in the cured state then the conditions suitable for producing clear, sharp negative images by peeling apart the imagewise exposed laminated element may be expressed as follows:

$$A_1 < A_2 \text{ and } A'_1 > A'_2$$

The value of the cohesive strength of the photocurable composition, both exposed and unexposed, must be greater than $A_1$, $A_2$, $A'_1$ and $A'_2$. The test for the various forces merely involves measuring at room temperature the load necessary to peel apart 1-inch wide strips of the laminated elements, both exposed to actinic radiation and unexposed. By room temperature, as used herein, it is intended that a range of temperatures from 10° C. to 40° C. shall be included.

Materials to serve as coating and laminating supports may include a wide variety of synthetic polymeric sheets, fibrous sheets such as papers of the opaque and semiopaque variety, i.e., glassine and papers used in the printing trades, glass and metal sheets, such as stainless steel, aluminum, etc. The primary requirement being that at least one of the supports must be transparent to the UV radiation, and that at room temperature the adhesive forces between the supports and the photocurable stratum must be uniform and satisfy the values set forth above and the cohesive strength of the photocurable composition must be greater than any of the adhesive forces.

The above conditions are met by coating on a support, a photocurable composition comprising a polyene containing at least two unsaturated carbon to carbon bonds per molecule and a polythiol containing two or more thiol groups per molecule. While thick coating layers of the photocurable composition can be used, the image quality is not as good as desired. Therefore, the maximum coating thickness is about 0.004 inch; the minimum coating thickness is about 0.00001 inch; and the preferred range is about 0.0003 to about 0.0006 inch.

The compositions to be photocured, in accord with the present invention may, if desired, include such additives as antioxidants, dyes, inhibitors, activators, fillers, pigments, antistatic agents, flame-retardant agents, thickeners, thixotropic agents, surface-active agents, light scattering agents, viscosity modifiers, extending oils, plasticizers, tackifiers and the like within the scope of this invention. Such additives are usually preblended with the polyene or polythiol prior to or during the compounding step. Operable fillers include natural and synthetic polymers and resins, carbon black, short glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, colloidal carbon, titanium dioxide, barium sulfate, various colored pigments, various organophilic silicas, bentonites, colloidal silicas, powdered glass, and the like. The aforesaid additives may be present in quantities up to 500 parts or more per 100 parts photocurable composition by weight and preferably 0.0005 to 300 parts on the same basis.

The type and concentration of additives must be selected with great care so that the final composition remains photocurable under practical conditions of exposure and with commercially feasible time cycles maintained throughout the operation. Additives which block out the passage of UV light or which detract from the stability of the photocurable composition must be avoided.

The compounding of the components prior to curing can be carried out in several ways. One useful method of compounding is to prepare by conventional mixing techniques (but in the absence of actinic radiation) a composition consisting of polyene, polythiol, UV sensitizer or photoinitiator, and other inert additives. This composition generally can be stored in the dark for extended periods of time. It could be charged to an aerosol can, drum, tube, or cartridge for subsequent use.

Conventional curing inhibitors or retarders operable in the instant invention include but are not limited to hydroquinone; p-tert-butyl catechol; 2,6-ditert-butyl-p-methylphenol; phenothiazine and N-phenyl-2-napthylamine. The majority of the commercially available monomers and polymers used in the photocurable compositions normally contain minor amounts (about 50 to 5,000 parts per million by weight) of inhibitors to prevent spontaneous polymerization prior to use in making a printing plate. The presence of these inhibitors in optimum amounts causes no undesirable results in the photocurable layer of this invention.

The molecular weight of the polyenes of the instant invention can be measured by various conventional methods including solution viscosity, osmotic pressure and gel permeation chromatography. Additionally, the molecular weight can be sometimes calculated from the known molecular weight of the reactants. The viscosity of the polyenes and polythiols was measured on a Brookfield Viscometer at 30° or 70° C. in accord with the instructions therefor.

The photocurable composition at ambient temperatures can vary from a liquid to a solid state, including a gel or elastomeric state. The photocurable composition may also contain a thickening agent to increase the viscosity of the photocurable liquid polymer. For example, cellulosic derivatives, finely divided silicas, and finely ground fibrous asbestos materials may be used. The preferred photocurable compositions of the instant invention have viscosities in the range of about 0.25 to about 350 poises and preferably from about 5 to about 150 poises at or below 70° C.

The supporting base material, i.e., the support employed, can be any natural or synthetic product capable of existence in film, sheet, or plate form and can be flexible or rigid, reflective or nonreflective of actinic light. Broadly, the support can be rubber, plastic, metal, paper, or glass. Plastics are preferably employed as a support. Suitable metals for a support include, but are not limited to steel, aluminum, magnesium and the like. Additionally, the support layer can be the photocurable composition per se. That is, a portion of the photocurable composition can be poured into a mold and exposed directly to actinic light to solidify the entire layer of the photocurable composition. After solidification, this layer will serve as a support for an additional amount of the photocurable composition poured on top of the support, which additional amount would form the relief after exposure through an image bearing transparency to actinic light.

As a support on which the photocurable composition is coated, there may be mentioned several types of substantially transparent films. Films composed of high polymers, e.g., polystyrene, polyamides, polyolefins, polyesters, vinyl polymers and cellulosics are quite suitable and in order for the above adhesive relationships to obtain these films may or may not contain an auxiliary layer to control anchorage. Specifically, the support can be composed of various film-forming plastics such as addition polymers, vinylidene polymers, e.g., vinyl chloride, vinylidene chloride copolymers with vinyl chloride, vinyl acetate, styrene, isobutylene and acrylonitrile; and vinylchloride copolymers with the latter polymerizable monomers; the linear condensation polymers such as the polyesters, e.g., polyethylene terephthalate; the polyamides, e.g., polyhexamethylene sebacamide; polyester amides, e.g., polyhexamethyleneadipamide/ adipate, and the like. Fillers or other reinforcing agents can be present in the synthetic resin or polymer support such as various fibers (synthetic, modified, or natural), e.g., cellulosic fibers, for instance, cotton, cellulose acetate, viscose rayon, paper; glass wool; nylon and the like. These reinforced bases may be used in laminated form.

When the support is highly reflective, e.g., aluminum, oblique rays of actinic light passing through the image bearing transparency and photocurable composition reflect off the support at such an angle as to cause curing in nonimage areas. To avoid this, a light absorptive layer is employed between the reflective support and the photocurable composition.

The light absorptive layer intermediate between the light-reflective support and the photocurable composition can be made from various materials. Suitable materials of this type are dyes and pigments. Useful inorganic pigments for a light absorptive layer include iron oxide in various forms, e.g., Indian red, Venetian red, ocher, umber, sienna, iron black and the like; lead chromate, lead molybdate (chrome yellow and molybdenum orange); cadmium yellow, cadmium red, chromium green, iron blue, manganese black, various carbon blacks such as lamp black, furnace black, channel black and the like. Organic dyes soluble in the vehicles normally used in applying the light absorptive layer are best added as pigments in the form of lakes prepared by precipitating an insoluble salt of the dye on an inert, inorganic substrate. A list of such lakes and similar organic pigments is shown in "Printing and Litho Inks," J. H. Wolfe, pages 124–173, Fourth Edition, MacNair-Dorland and Co., New York (1949).

If a light-absorptive layer is employed as taught above, it must have adequate adhesion to the support and photocured layer. Said adhesion is usually supplied by suitable polymeric or resin carriers which include, but are not limited to, vinyl halides, e.g., polyvinyl chloride; vinyl copolymers particularly of vinyl halides, e.g., vinyl chloride with vinyl acetate, diethyl fumarate, ethyl acrylate, allyl glycidyl ether, glycidyl methacrylate; vinyl chloride/vinyl acetate/maleic anhydride copolymer; polyvinyl butyral; monomeric dimethylacrylate esters of the polyethylene glycols in combination with vinyl chloride copolymers; and styrene or diallyl phthalate with polyesters such as diethylene glycol maleate, diethylene glycol maleate/phthalate, triethylene glycol fumarate/sebacate, and the like.

Suitable materials employed as a light absorptive material used with a reflective support are dyes and pigments. Pigments are preferred primarily because they do not bleed into the photocurable layer. In any event these materials must be unreactive with the photocurable layer. These light absorptive materials are preferably applied to the support in suspension in a polymer or resin capable of adhering to the support and the photocurable composition.

After coating, a second film, preferably having a matte surface, and for which $A_2>A_1$ for unexposed photocurable material at room temperature, is laminated to the surface of the photocurable layer at temperatures ranging from about 20° to about 70° C. and preferably at pressures above 40 p.s.i.a. The second film, or top cover, may have the matte or anchoring characteristic as an integral part of the film rather than as a separate layer. Films or sheets suitable for the laminated top cover may be taken from any of the above transparent polymeric films. The surface to be laminated to the surface of the photocurable stratum is modified so that the adhesion ($A_2$) of the unpolymerized stratum is greater then the adhesion ($A_1$) to the substantially transparent film support. Specific high polymer films include: polyamides, i.e., polyhexamethylene sebacamide, polyhexamethylene adipamide; polyethylene, polypropylene, polyesters, i.e., polyethylene terephthalate, polyethylene terephthalate/isophthalate copolymers, vinyl acetals, vinylidene chloride copolymerized with vinyl chloride, styrene and acrylonitrile, cellulose acetate, cellulose acetate/butyrate, viscose rayon, etc. Other laminating supports include translucent drafting films described in U.S. Pat. No. 2,964,423, dated Dec. 13, 1960, and U.S. Pat. No. 3,115,420, dated Dec. 24, 1963. The above patents comprise a polyester support having thereon a layer containing a particulate material. In the above patents, the layer comprises a ureaformaldehyde resin having dispersed therein a solid inorganic toothing agent having an average particle size from 0.1 to 10 microns. Suitable supports may also be used wherein the particulate material is dispersed throughout the film rather than in a surface coating. The film supports of U.S. Pat. No. 2,627,088 are also suitable. The films disclosed and claimed therein comprise a polyester film having on the surface thereof as an anchoring layer, a copolymer containing at least 35% vinylidene chloride, the remainder comprising an acrylic acid ester and itaconic acid. Other surface treatments which will provide the laminating supports with the required adhesion characteristics comprise flame treating, treatment with electrostatic discharge, and also treating with chromic acid.

In addition, the top cover may also be a glass or semitransparent paper.

The reason why it is preferable to have a matte surface or layer on the side of the top cover which contacts the uncured photocurable stratum, is that after imagewise exposure and separation of the top cover from the support, a pencil can be used to indicate changes, etc., on the matte surface. The same applies to the support. The support layer can be transparent, so that the exposure to the negative can be through the support layer, in which case, if the support layer contains a matte layer, such matte layer should be essentially transparent. So it can be stated that any matte layer should be essentially transparent. Besides a matte layer, other substrates can be used for other reasons, to which the photocurable composition adhere.

It is important to select the correct exposure time in the photocuring process of this invention. It is essential that the exposure be sufficient to harden the photocurable composition in the exposed image areas without causing significant curing in the nonimage areas. Aside from exposure time and light intensity, the extent of the exposure is dependent on the thickness of the photocurable layer, the curing temperature, the structure and functionality of the polyene and polythiol employed, the photoinitiator type and concentration, the photocuring rate, the presence of light absorbing pigments or dyes in the photocurable composition, and the character of the image to be reproduced. In general, the thicker the layer to be photocured, the longer the exposure time. It has been observed that photocuring starts at the surface of the photocurable layer closest to the light source and proceeds downward to the support. With insufficient exposure, the layer may have a hard photocure at the surface but, through lack of a clear-through photocure, the relief will be removed when the unexposed area is removed. Inasmuch as the photocuring rate usually increases at higher temperatures, less exposure is required thereat than at room temperature. Thus ultraviolet light sources that emit heat or the concurrent use of an infrared lamp with the UV lamp, etc., are more efficient than cold ultraviolet light sources. However, care must be exercised that too high a temperature is not attained during the photocure, as this leads to, in some cases, thermal expansion of the photocurable composition which results in image distortion. Hence, it is preferred that the photocuring be carried out at a temperature in the range of about 20° to about 70° C. Due to the number of variables which affect exposure time, optimum results are best determined by trial and error, e.g., stepped exposures with characterization after each exposure.

Photocured images can also be prepared by the instant invention by projection through a suitable lens system.

When using a broad light source such that oblique rays are emitted, even a thin top cover between the surface of the transparency and the photocurable layer causes some broadening of the image. Ordinarily this has very little effect except in the preparation of halftone or line plates with fine lines. Such plates are best prepared with the negatives directly in contact with the outer surface of the top cover, except for a thin layer of a parting agent such as silicone oil. For this reason, a point or collimated light source is preferred. In this latter case, an airgap can be employed, if desired, between the outer surface of the top cover and the surface of the image-bearing transparency, stencil, etc.

A suitable apparatus for exposure of the photocurable element is given in a copending application having Ser. No. 674,773, inventors: Werber, Wszolek, and Kehr, filed: Oct. 12, 1967, and assigned to the same assignee, now abandoned.

Various light sources can be used to obtain sufficient UV light to practice the instant invention. Such sources include carbon arcs, mercury arcs, fluorescent lamps with spacial ultraviolet light emitting phosphors, zenon arcs, argon glow lamps, and photographic flood lamps. Of these, the mercury vapor arcs, particularly the sunlamp type, and the xenon arcs are very useful. The sunlamp mercury vapor arcs are customarily used at a distance of 7 to 10 inches from the photocurable layer, whereas the xenon arc is placed at a distance of 24 to 40 inches from the photocurable layer. With a more uniform extended source of low intrinsic brilliance, such as a group of contiguous fluorescent lamps with special phosphors, the plate can be exposed within an inch of the lamps.

It is preferred that the light emanate from a point source of in the form of parallel rays but divergent beams are also operable as a source of actinic light in the instant invention. An airgap can be maintained between the photocurable element and the image-bearing transparency. Such an airgap can range in width up to about 250 mils or more.

The element is preferably exposed to actinic radiation through the transparent support having the lower adhesion for the cured polymer on which it is desired to have the cured portion adhere. The exposure may be by means of a light source which is rich in ultraviolet radiation through a halftone or line image transparency, e.g., process negative or positive (an image-bearing transparency consisting solely of substantially opaque and substantially transparent areas where the opaque areas are substantially of the same optical density.) Engineering drawings are also to be considered within the purview of the above description. The time required for exposure will range from a few seconds to several minutes depending on the intensity of the exposing radiation and the inherent curing rate of the composition. After exposure, the top cover and support are separated by peeling apart at room temperature. For best results, the top cover and support are separated at a moderate rate of about 0.1 to 25 inches per second. In the preferable procedure, the exposed areas of the photocurable stratum adhere to the support. The support can have a matte surface as a separate layer or integrally therewith, or a surface treated in such a manner that the adhesion of the photocured composition to the support is greater than the adhesion of said composition to the surface of the top cover.

The transparent or translucent photocurable composition layer is photocured clear through to the support where exposed to actinic light, whereas the unexposed areas remain in substantially their original state, i.e., no significant curing takes place in the areas protected by the opaque image in the image-bearing transparency. The term essentially transparent, as used throughout this application, encompasses both the terms transparent and translucent. If a viscous liquid or gel photocurable composition is initially used, the uncured portion readily separates from the photocured portions when the two outer sheets are pulled apart. A high-temperature treatment may be necessary if a solid photocurable composition is initially used.

One advantage of the instant invention is that line and halftone images can be reproduced very easily, rapidly and accurately.

A convenient method of carrying out the process of this invention is to place the image-bearing, line or halftone stencil or positive or negative transparency parallel to the transparent top cover of the photocurable element. The image-bearing transparency and the surface of the transparent top cover can be in contact of have an airgap therebetween as desired. In photocurable layer is exposed through the transparency to a source of actinic light, preferably a point or collimated light source when a liquid photocurable composition is used, until the photocurable layer is photocured to an insoluble stage in the exposed areas. The thickness of the ultimate relief in such a process can be controlled by varying the thickness of the layer of the photocurable composition. This can be done for example by inserting removable picture frame type molds of the desired thickness on the support, casting the photocurable composition into the mold, removing any excess with a doctor blade or similar means, and laminating on the top cover. If the photocurable composition is a solid under atmospheric conditions, the mold is not necessary as the composition can be precast at elevated temperatures in liquid form to any desired thickness and thereafter solidified. Or, the mold can consist of an adhesive-type tape fixed around the edge of the support so that after the top cover is placed over the photocurable layer, the edges of the support and top cover can be then sealed by the adhesive-type tape.

Prior to photocuring, the photocurable liquid polymer compositions can be formulated to be used as 100 percent solid compounds (i.e., no volatile ingredients), or they can be used in organic solvent solutions at both low and high total solids contents, or they can be used as dispersions or emulsions in aqueous media.

The photocured image transparency (negative or positive) of this invention can be used in overhead projectors. The positive and negative photocured image transparencies of this invention can be used to make additional copies, either with silver halide film or other image reproduction elements.

The photocurable elements of this invention are used to prepare transparent, black and white or colored negative and positive images which may serve a variety of useful purposes. They can be used, for example in photographic sciences or graphic arts as substitutes for conventional (silver emulsion) photographic high contrast negatives and positives. Further, they can be used as visual aids by projection, or they can be used as proofs of various types of original art work or other images, either singly or as multiple layer overlays.

The photocurable liquid polymer compositions of the instant invention prior to photocuring can readily be pumped, poured, siphoned, brushed, sprayed, doctored, rolled, trowelled, dip-coated, extruded or gunned into place into cavities, molds, or onto vertical or horizontal flat surfaces in a uniform fashion.

The following examples will aid in explaining, but should not be deemed as limiting, the instant invention. In all cases, unless otherwise noted, all parts and percentages are by weight.

EXAMPLE 1

3456.3 g. (1.75 mole) of poly (propyleneether) glycol, commercially available under the trade name "PPG 2025" from Union Carbide, and 1.7 g. of di-n-butyl tin dilaurate were placed in a 5-liter, round-bottom, three-neck flask. The mixture in the flask was degassed at 110° C. for 1 hour and was then cooled to 25° C. by means of an external water bath. 207 g. (3.50 moles) of allyl alcohol, with stirring, were added to the flask. 609.0 g. (3.50 moles) of an 80–20 percent isomer mixture of tolylene-2,4-diisocyanate and tolylene-2,6-diisocyanate, respectively, sold under the trade name "Mondur TD 80," was charged to the flask. The mixture was stirred well. The flask was cooled by the water bath during this period. Eight minutes after the "Mondur TD 80" was added, the temperature of the mixture was 59° C. After 20 minutes, the NCO content was 12.39 mg. NCO/g.; after 45 minutes, it was 9.87 mg. NCO/g.; and after 75 minutes, it was 6.72 mg. NCO/g. The water bath was removed 80 minutes after the "Mondur TD 80" had been added, the temperature of the mixture being 41° C., and heat was applied until the mixture temperature reached 60° C. That temperature was maintained. 105 minutes after the "Mondur TD 80" was added, the NCO content was 3.58 mg. NCO/g.; after 135 minutes, it was 1.13 mg. NCO/g.; after 150 minutes, it was 1.13 mg. NCO/g.; and after 195 minutes, it was 0.42 mg. NCO/g. At that point in time, the resultant polymer composition was heated to 70° C., and vacuum-stripped for one hour. The resultant polymer composition was labeled composition 1, and had a viscosity of 16,000 c.p.s. as measured on a Brookfield Viscometer at 30° C. Unless otherwise stated, all the viscosity measurements were made on a Brookfield Viscometer at 30° C.

The above procedure was repeated five times, and resultant compositions were labeled compositions 2 to 6, respectively. The heating step lasted 180 minutes, 140 minutes, 140 minutes, 205 minutes and 180 minutes, respectively. With composition 2, the temperature was 60° C. after 8 minutes; with composition 3, the temperature was 57° C. after 6 minutes; with composition 4, the temperature was 41° C. after 20 minutes, at which time the temperature was raised and held at 60° C.; with composition 5, the temperature was 57.5° C. in 8 minutes, was 42° C. in 40 minutes, then taken up to 60° C. and lowered to 58° C. after 120 minutes; and with composition 6, the temperature was 57° C. in 6 minutes, and was 41° C. after 60 minutes, at which time the temperature was immediately raised to 60° C. The viscosity of the resultant polymer compositions was 15,500 c.p.s.; 16,000 c.p.s.; 17,000 c.p.s.; 16,800 c.p.s. and 16,200 c.p.s.; respectively.

Compositions 1, 2, 3, 4, 5, and 6 were placed in a 6-gallon container and stirred well. The resultant polymer composition had a viscosity of 16,600 c.p.s. and the NCO content was 0.01 mg. NCO/g. This composite polymer composition was labeled polymer A.

Polythiol A was pentaerythritol tetrakis (β-mercaptopropionate), which is commercially available under the trade name "Q-43 Ester" (sold by Carlisle Chemical Company). 20 parts of Polymer A, two parts of polythiol A and one part of acetophenone were placed into a liter container and thoroughly mixed. This resulted in photocurable composition A.

Photocurable composition A was coated onto a UV transparent "Mylar" film support which was 5 mils thick. "Mylar" is a trade name for a commercially available stabilized polyethylene terephthalate resin (sold by E. I. duPont de Nemours & Co., Inc.). The thickness of the photocurable composition A layer varied from 0.5 to 1 mil. A one-mil-thick UV transparent "Mylar" top cover was placed on the photocurable composition A layer and the exposed edges of the element were sealed with adhesive tape. A single tone (or a line) negative transparency was placed on the top cover of the element. The negative transparency was irradiated with UV light from a Westinghouse Sun Lamp (Model No. RS 275 Watt) at a distance of 6 to 8 inches for 30 seconds. The seal of adhesive tape was removed and the two 37 Mylar" sheets were carefully stripped apart. The photocured portion of photocurable composition A (hardened) adhered to the "-Mylar" top cover (thinner sheet) to produce a positive. The uncured portion of photocurable composition A adhered to the "Mylar" film support (thicker sheet) to produce a negative. The positive was exposed directly to UV light (without a negative transparency interposed therebetween) for 30 seconds to photocure the photocurable composition A thereon. Thus, both a photocured (hardened) negative and positive were produced.

EXAMPLE 2

Example 1 was repeated, except that photocurable composition A was coated on a piece of standard bond paper instead of the 5-mils-thick "Mylar" film support. When the bond paper and the "Mylar" top cover were stripped apart, the photocured portion of photocurable composition A adhered to the "Mylar" top cover to produce a positive. The uncured portion of photocurable composition A adhered to the bond paper to produce a negative which was subsequently cured (hardened) by direct exposure to UV light for 30 seconds. Thus, both a photocured (hardened) negative and positive were produced.

EXAMPLE 3

20 parts of polymer A, two parts of polythiol A, one part of acetophenone and 1.2 part of carbon black (commercially available under the trade name "Sterling MT," sold by Cabot Corporation) were placed into a liter container and thoroughly mixed. This resulted in photocurable composition B.

The remaining portion of Example 1 was repeated, except that photocurable composition B was used instead of photocurable composition A. Thus, an easily readable black negative and positive were produced, the top cover being the positive.

Photocuring of photopolymer composition A for 10 to 60 seconds, under the conditions of Example 1 was found to be sufficient, but it is thought that the curing time is somewhat dependent upon film thickness—thicker films requiring longer exposure times.

Example 1 was repeated, except that carbon black was dusted on the uncured photocurable composition A on the "-Mylar" film support. The photocurable composition A was then irradiated, producing an easily readable negative.

Example 1 was repeated, except that carbon black was dusted on the photocured negative and positive, making them both easily readable.

EXAMPLE 4

Example 1 was repeated, except that photocurable composition A was coated on a piece of silicon-coated release paper instead on the 5-mils-thick "Mylar" film support. When the release paper and the "Mylar" top cover were stripped apart, the photocured portion of photocurable composition A adhered to the "Mylar" top cover to produce a positive. The uncured portion of photocurable composition A adhered to the release paper to produce a negative, which was subsequently cured (hardened) by direct exposure to UV light for 30 seconds. Thus, both a photocured (hardened) negative and positive were produced.

EXAMPLE 5

10 g. of polymer A, 1 g. of polythiol A, 0.5 g. of acetophenone, 0.6 g. of carbon black ("Sterling MT") and 2 g. of "Pluronic F88" were placed into a container and thoroughly mixed. "Pluronic F88" is a trade name for a copolymer of ethylene oxide and propylene oxide, which is commercially available from Wyandotte Chemical Co. The photocurable composition was allowed to cool whereupon it solidified to a soft wax with the carbon remaining dispersed therein. A sheet of glass was placed on a hot plate. The photocurable composition was placed on the sheet of glass and spread evenly over the glass surface. While the photocurable composition was still hot, a 2-mil-thick sheet of "Mylar" film (the top cover) was placed over it. The assembly was cooled to room temperature. The top cover of the assembly was exposed through a line photographic negative for 5 minutes using 4 RS sunlamps (275 watts). The negative transparency was in contact with the top cover and the sunlamps were 9 inches from the negative transparency. The "Mylar" top cover was stripped away from the rest of the assembly—the uncured portion of the photocurable composition stuck to the top cover, forming a negative. The top cover was exposed as above for 1 minute, which photocured the photocurable composition adhering imagewise thereto.

EXAMPLE 6

Example 3 was repeated, except that a halftone negative transparency was used in place of the line negative transparency. An easily readable negative and positive were produced, with the resultant dots being clear and sharp. The top cover was the positive.

EXAMPLE 7

Example 3 was repeated, except that the "Mylar" top cover was laminated (under 50 p.s.i. pressure) onto the rest of the assembly at a temperature of 50° C. An easily readable negative and positive were obtained, the top cover being the positive.

EXAMPLE 8

Example 3 was repeated, except that 2.1 parts of trimethylolpropane tris (β-mercaptopropionate) was used in place of pentaerythritol tetrakis (β-mercaptopropionate). An easily readable negative and positive were produced, the top cover being the positive.

EXAMPLE 9

Example 3 was repeated, except that half of the pentaerythritol tetrakis (β-mercaptopropionate) was replaced with 1.3 parts of ethylene glycol bis (β-mercaptopropionate). An easily readable negative and positive were produced, the top cover being the positive.

EXAMPLE 10

Example 3 was repeated, except that 1.8 parts of trimethylolpropane tris (thioglycolate) was used in place of pentaerythritol tetrakis (β-mercaptopropionate). An easily readable negative and positive were produced, the top cover being the positive.

EXAMPLE 11

Example 3 was repeated, except that 1.8 parts of pentaerythritol tetrakis (thioglycolate) was used in place of pentaerythritol tetrakis (β-mercaptopropionate). An easily readable negative and positive were produced, the top cover being the positive.

EXAMPLE 12

To a 2-liter flask equipped with stirrer, thermometer and gas inlet and outlet was charged 450 g. (0.45 moles) of polytetramethyleneether glycol, having a hydroxyl number of 112 and a molecular weight of about 1,000, along with 900 g. (0.45 moles) of polytetramethyleneether glycol having a hydroxyl number of 56 and a molecular weight of about 2,000, both commercially available from Quaker Oats Co. The flask was heated to 110° C. under vacuum and nitrogen and maintained thereat for 1 hour. The flask was then cooled to approximately 70° C. whereat 0.1 g. of dibutyl tin dilaurate was added to the flask. A mixture of 78 g. (0.45 moles) of tolyene diisocyanate and 78 g. (0.92 moles) of allyl isocyanate was thereafter added to the flask dropwise with continuous stirring. The reaction was maintained at 70° C. for 1 hour after addition of all the reactants. This polymer composition was labeled polymer C.

A liquid photocurable composition was prepared by mixing 102.3 g. of polymer C, 7.7 g. of pentaerythritol tetrakis (β-mercaptopropionate), 1.5 g. of benzophenone and 0.1 g. of 2,6-ditertiary-butyl-methyl phenol. The mixture was heated to 70° C. to dissolve the benzophenone and thereby producing a clear homogeneous mixture. The edges of a 4-mil-thick "Mylar" film support were wrapped with a 3.5-mil-thick rubber electric tape so that it formed a raised lip around the edge of the "Mylar" film support. The film support was leveled on an adjustable flat table and the liquid photocurable composition at a temperature of 70° C. was poured onto the film support along the edges of the frame and distributed evenly throughout the film support by means of a doctor blade. A 1-mil-thick "Mylar" top cover was placed on the photocurable composition and the tape was pressed over onto the top cover to seal the edges of the element. A halftone negative under a glass plate was placed 11 mils above the element. The photocurable composition was exposed through the negative to light from a 400-watt Ascorlux xenon arc printing lamp, commercially available from American Speed Light Co., placed 29 inches above the plate. The exposure was for 3 minutes and 40 seconds during which time the liquid photocurable composition gelled in the image areas. The nonimage areas remained a liquid essentially of the same viscosity as prior to exposure. After exposure, the negative was removed. The seal of tape was removed and the two "Mylar" sheets were stripped apart. The photocured portion of the photocurable composition adhered to the top cover to produce a positive and the uncured portion adhered to the film support to produce a negative. The uncured portion was cured as above for 1 minute. The relief on both "Mylar" sheets had a depth of 3.5 mils. Thus, both a photocured (hardened) negative and positive were produced.

EXAMPLE 13

Example 3 was repeated, except that 18 parts of polymer D was used in place of polymer A. Polymer D was prepared as follows: 458 g. (0.23 moles) of a commercially available liquid polymeric diisocyanate sold under the trade name "Adiprene L-100"by E. I. duPont de Nemours & Co. was charged to a dry resin kettle maintained under a nitrogen atmosphere and equipped with a condenser, stirrer, thermometer, and gas inlet and outlet. 37.8 g. (0.65 moles) of allyl alcohol was charged to the kettle and the reaction was continued for 17 hours with stirring at 100° C. Thereafter, the nitrogen atmosphere was removed and the kettle was evacuated 8 hours at 100° C. 50 cc. dry benzene was added to the kettle and the reaction product was azeotroped with benzene to remove the unreacted alcohol. This allyl-terminated liquid polymer had a molecular weight of approximately 2,100, and was labeled polymer D.

An easily readable negative and positive were produced, with the top cover being the positive.

EXAMPLE 14

Example 3 was repeated, except that 17 parts of polymer E was used in place of polymer A. polymer E was prepared as follows: 1 mole of commercially available polyethyleneether glycol having a molecular weight of 1450 and a specific gravity of 1.21 was charged to a resin kettle maintained under nitrogen and equipped with a condenser, stirrer, thermometer and a gas inlet and outlet. 2.9 g. dibutyl tin dilaurate as a catalyst was charged to the kettle along with 2 moles tolylene-2,4-diisocyanate and 2 moles of allyl alcohol. The reaction was continued with stirring at 60° C. for 2 hours. Thereafter, a vacuum of 1 mm. was applied for 2 hours at 60° C. to remove the traces of excess alcohol. This $CH_2=CH-$terminated polymer had a molecular weight of approximately 1,950, and was labeled polymer E.

An easily readable negative and positive were produced, with the top cover being the positive.

EXAMPLE 15

Example 3 was repeated, except that 28 parts of polymer F was used in place of polymer A. Polymer F was prepared as follows: To a 1-liter resin kettle equipped with stirrer, thermometer, gas inlet and outlet and heated to a temperature of 50° C. was charged 610 g. (0.2 mole) of polytetramethyleneether glycol, commercially available from Quaker Oats Co. and having a hydroxyl number of 37.1 and a molecular weight of 3,000, along with 0.3 g. dibutyl tin dilaurate. The temperature of the kettle was raised to 110° C. and the contents were freed of water under 1 mm. vacuum for 1 hour. The resin kettle was cooled to 60° C. and the system was placed under a protective atmosphere of nitrogen throughout the remainder of the reaction. 34.0 g. of allyl isocyanate (0.4 mole) was added dropwise to the kettle at such a rate as to maintain the temperature at 60° C. When the NCO content dropped to 0.54 mg./g., 1 mm. vacuum again was applied and the system was heated at 70° C. for 1 hour. The thus formed polymer product was a solid at room temperature but at 50° C. is clear and pourable. The polymer product had a viscosity of 1,800 centipoises at 70° C. as measured on a Brookfield Viscometer and an average molecular weight of approximately 3,200 and was labeled polymer F.

An easily readable negative and positive were produced, with the top cover being the positive.

EXAMPLE 16

Example 3 was repeated, except that 28 parts of polymer H was used in place of polymer A. Polymer H was prepared as follows: 1500 g. (0.47 moles) of a linear solid polyester diol having a molecular weight of 3,200 and commercially available from Hooker Chemical Corp. under the trade name "Rucoflex S–1011–35" was charge to a 3-liter three-necked flask and heated to 110° C. under vacuum and nitrogen for 1 hour with stirring. 83 g. of allyl isocyanate having a molecular weight of 83.1 and commercially available from Upjohn Co. was added to the flask along with 0.3 cc. of dibutyl tin dilaurate (catalyst), commercially available from J. T. Baker. The reaction was continued at 110° C. with stirring for 1 hour. This allyl-terminated polymer was labeled polymer H.

An easily readable negative and positive were produced, with the top cover being the positive.

EXAMPLE 17

Example 3 was repeated, except that 25 parts of polymer I was used in place of polymer A. Polymer I was prepared as follows: 1500 g. (0.48 moles) of a commercially available linear solid polyester diol, sold under the trade name "S–106" by Hooker Chemical Corp., was charged to a 3-liter flask equipped with stirrer and heated to 110° C. under vacuum and nitrogen. After 1 hour at that temperature, it was cooled to about 60° C. whereat 81 g. of allyl isocyanate was slowly added by means of a dropping funnel along with 0.3 cc. of dibutyl tin dilaurate. The mixture was stirred for 1 hour at a temperature in the range of 70° to 80° C. This allyl-terminated olymer was labeled polymer I.

An easily readable negative and positive were produced, with the top cover being the positive.

EXAMPLE 18

Example 3 was repeated, except that 25 parts of polymer J was used in place of polymer A. Polymer J was prepared as follows: 300 g. (0.097 moles) of a commercially available linear solid polyester diol, sold under the trade name "S–108" by Hooker Chemical Co., along with 0.1 cc. of dibutyl tin dilaurate were charged to a 1-liter four-necked flask equipped with stirrer. The mixture was heated to 110° C. under vacuum and nitrogen and maintained thereat for 1 hour. The mixture was then cooled to 60° C. whereat 16 g. of allyl isocyanate was added and the mixture was heated to 75° C. with stirring and maintained thereat for 1 hour. This allyl-terminated polymer was labeled polymer J.

An easily readable negative and positive were produced, with the top cover being the positive.

EXAMPLE 19

Example 3 was repeated, except that 20 parts of polymer K was used in place of polymer A. Polymer K was prepared as follows: 240 g. (.12 moles) of a polyether diol, i.e., polytetramethyleneether glycol, having a molecular weight of 1,990 commercially available from the Quaker Oats Co. under the trade name "Polymeg 1,990," were charged to a 500 ml. three-necked flask equipped with stirrer. The flask was heated to 110° C. under vacuum and nitrogen and maintained thereat for 1 hour. The flask was then cooled to approximately 70° C. whereat 0.1 cc. of dibutyl tin dilaurate along with 14 g. (0.25 moles) of allyl alcohol were added to the flask and stirring was continued for 15 minutes. Thereafter, 42 g. (0.24 moles) of tolylene diisocyanate (molecular weight 174) commercially available from Mobay Chemical Co. under the trade name "-Mondur TD–80" was added to the flask by means of a dropping funnel and the reaction was continued with stirring for 1 hour. This allyl-terminated polymer was labeled polymer K.

An easily readable negative and positive were produced, with the top cover being the positive.

EXAMPLE 20

Example 3 was repeated, except that 33 parts of polymer L was used in place of polymer A. Polymer L was prepared as follows: 600 g. (0.11 moles) of a polypropyleneether triol called under the trade name "Triol 6000" by Union Carbide Corp. was charged to a 1-liter resin kettle along with 0.3 g. of dibutyl tin dilaurate. The kettle was heated to 110° C. under vacuum and maintained thereat for 1 hour. The kettle was then cooled to approximately 50° C. whereat 28.4 g. (0.342 moles) of allyl isocyanate was added slowly to keep the exotherm between 60° to 67° C. NCO after 20 minutes was 0.62 mg. NCO/g. This polymer was then placed under vacuum at 70° C. for 1 hour followed by an additional vacuuming at 90° C. for 2 hours. This allyl-terminated polymer was labeled polymer L.

An easily readable negative and positive were produced, with the top cover being the positive.

EXAMPLE 20

Example 3 was repeated, except that 25 parts of polymer M was used in place of polymer A. Polymer M was prepared as follows: 600 g. (0.22 moles) of a polypropyleneether triol having a molecular weight of 2960 and commercially available under the trade name "Triol 3000" by Union Carbide Corp. was charged to a 1-liter resin kettle along with 0.3 g. of dibutyl tin dilaurate. The kettle was heated to 110° C. under vacuum and maintained thereat for 1 hour. The kettle was cooled to 60° C. whereat 40 g. (0.48 moles) of allyl isocyanate was added dropwise from a dropping funnel to the reaction mixture. After 20 minutes, the NCO content was 0.80 mg. The thus formed prepolymer was then maintained under vacuum at 70° C. for 1 hour followed by 2 hours at 90° C. This allyl-terminated polymer was labeled polymer M.

An easily readable negative and positive were produced, with the top cover being the positive.

EXAMPLE 22

Example 3 was repeated, except that 1 part of cyclohexanone was used as the photocuring accelerator (photoinitiator) in place of acetophenone. Both a negative and positive were produced, with the top cover being the positive.

EXAMPLE 23

Example 3 was repeated, except that 2 parts of acetone was used as the photocuring rate accelerator (photoinitiator) in place of acetophenone. Both a negative and positive were produced, with the top cover being the positive.

EXAMPLE 24

Example 3 was repeated, except that 1.5 parts of methyl ethyl ketone was used as the photocuring rate accelerator (photoinitiator) in place of acetophenone. Both a negative and positive were produced, with the top cover being the positive.

EXAMPLE 25

Example 3 was repeated, except that the photocurable composition contained one part of "Emtal Talc" as a filler. "Emtal Talc" is a talc commercially available from Easter Magnesia Talc Co. of Burlington, Vt. Both a negative and positive were obtained, with the top cover being the positive.

EXAMPLE 26

Example 3 was repeated, except that the photocurable composition contained 3 parts of "Hi Sil 233" as a filler. "Hi Sil 233" is the trade name for finely divided silica filler, having a particle size of 0.03 micron, and is commercially available from Columbia Southern Division of PPG Industries, Inc. Both a negative and positive were obtained, with the top cover being the negative.

EXAMPLE 27

Example 3 was repeated, except that 1.5 parts of benzophenone was used as the photocuring rate accelerator (photoinitiator) in place of acetophenone and that a halftone positive was used in place of the line negative. Both a negative and positive were obtained, with the top cover being the negative.

EXAMPLE 28

23.8 g. of ethylene glycol bis (β-mercaptopropionate); 25.6 g. of the reaction product of one mole of 1,4-butane;iol with two moles of allyl isocyanate; and 0.5 g. of benzophenone were thoroughly admixed. The photocurable composition was coated onto a UV transparent "Mylar" film support which was 5-mils thick. The thickness of the photocurable composition was about 0.5 mil. A 1-mil-thick UV transparent "Mylar" top cover was placed on the photocurable composition layer and the exposed edges of the element were sealed with adhesive tape. The element was exposed through the top cover to a 275-watt RS sunlamp at a distance of 9 inches through a negative line transparency for 15 minutes at a temperature of 30° C. In the imaged areas the photocurable composition hardened to a solid. Upon separating the "Mylar" support and cover, the hardened portion of the photocurable composition stuck to the top cover, forming a positive. The film support was exposed (not imagewise) for 1 minute to the sunlamp, which photocured the photocurable composition adhering imagewise thereto. Thus both a photocured positive and negative were produced. This example illustrates the use of a monomeric polythiol and a monomeric polyene in the preparation of a photocurable composition.

EXAMPLE 29

27 g. of the triacrylate of the reaction product of one mole of trimethylol propane with 20 moles of ethylene oxide, 9 g. of pentaerythritol tetrakis (β-mercaptopropionate), and 0.5 g. of benzophenone were admixed. Example 28 was repeated, except that the above photocurable composition was substituted for the photocurable composition used in Example 28. Thus, both a photocured positive and negative were produced. This example illustrates the use of a reactive ene group conjugated with another double bond grouping (C=O).

EXAMPLE 30

50 g. of a liquid polybutadiene derivative having a molecular weight of about 2,200 and a double bond distribution consisting of about 60% trans-1,4-; about 20% cis-1,4; and about 20% vinyl-1,2; and which is commercially available from Sinclair Petrochemicals, Inc., under the trade name "Poly B-D-R 45-M"a; 5 g. of pentaerythritol tetrakis (β-mercaptopropionate); and 0.5 g. of benzophenone were admixed. Example 28 was repeated, except that the above photocurable composition was substituted for the photocurable composition used in Example 28. Thus, both a photocured positive and negative were produced.

EXAMPLE 31

10 g. of "Gentro 1002" (which is the trade name for a solid SBR rubber which is commercially available from General Tire and Rubber Co.), which was dissolved in 50 g. of decalin (as a solvent), 1 g. of pentaerythritol tetrakis (β-mercaptopropionate), 0.5 g. of benzophenone, and 0.1 g. of silica ("Hi Sil 233"), added as a thickening agent, were admixed. "Hi Sil 233" is the trade name for a finely divided silica filler, having a particle size of 0.03 micron and is commercially available from Columbia Southern division of PPG Industries, Inc. Example 28 was repeated, except that the above photocurable composition was substituted for the photocurable composition used in Example 28. Thus, both a positive and negative were produced.

EXAMPLE 32

50 g. of "Dion Polymercaptan Resin DPM-1002," which is commercially available from Diamond Alkali Company, and is a thiol-terminated liquid polymer having a functionality of 2 to 3 and a molecular weight of about 5000; 2.5 g. of triallyl cyanurate, and 0.5 g. of benzophenone were admixed. Example 28 was repeated, except that the above photocurable composition was substituted for the photocurable composition used in Example 28. Thus, both a positive and a negative were produced. This example illustrated the use of a photocurable composition containing a monomeric polyene and a polymeric polythiol.

EXAMPLE 33

Example 28 was repeated, except that the photocurable composition contained 50 g. of the polymeric polyene used in Example 21; 60 g. of the polymeric polythiol used in Example 32; and 0.5 g. of benzophenone were admixed. Thus, both a positive and a negative were produced. This example illustrated the use of a photocurable composition containing a polymeric polyene and a polymeric polythiol.

EXAMPLE 34

Various carbon black particles were placed in a photocurable composition, (termed photocurable composition C) which contained 100 parts by weight polymer C, 7.7 parts by weight "Q-43 Ester" and 0.5 parts by weight benzophenone. 0.5 parts by weight of each carbon black sample was placed in 10 parts by weight photocurable composition. The blending was achieved on a Hoover Muller pigment dispersing machine to achieve a homogenous mixture. The photocurable compositions (containing carbon blacks) were coated (layer thickness was 0.5 to 1 mil) onto a polymer film (2-4 mils thick). The imagewise exposure was through a line negative by a Westinghouse 275-watt RS sunlamp at a distance of 1 foot. The uncured portions were removed. The effect of the various carbon blacks and their particle diameters upon photocuring retardation is given in Table I. Also, their tinting strength is given in Table I. "Sterling FT" carbon black appeared to be the preferred carbon black tested.

TABLE I

[Effect of various carbon blacks on photocuring time]

| Carbon black | Particle diameter (millimicrons) | Photocuring time (minutes) | Comments on Tinting results |
|---|---|---|---|
| Black pearls: | | | |
| 2 [1] | 12 | >10 | Dark brown—black. |
| 70 [1] | 15 | >10 | Do. |
| 71 [1] | 16 | >10 | Do. |
| 74 [1] | 17 | >10 | Do. |
| Spheron: | | | |
| 6 [1] | 25 | >10 | Do. |
| 9 [1] | 27 | 5-10 | Dark brown. |
| Mogul A [1] | 28 | 5-10 | Do. |
| Vulcan SC [1] | 22 | >10 | Do. |
| Elftex 5 [1] | 27 | >10 | Do. |
| Sterling: | | | |
| 50 [1] | 41 | >10 | Do. |
| V [1] | 50 | >10 | Dark gray—black. |
| 99 [1] | 42 | >10 | Do. |
| FT [1] | 180 | 8 | Do. |
| MT [1] | 250 | 8 | Grayer. |
| Austin black [2] | 1,000 | 2 | Do. |
| Charcoal [3] | 1,000 | 1 | Do. |
| Graphite [4] | 10,000 | 3 | Do. |

[1] Commercially available from Cabot Carbon Co.
[2] Commercially available from Slab Fork Coal Co.
[3] Commercially available from Atlas Power Co.
[4] Commercially available from Fisher Scientific Co.

EXAMPLE 35

The effect of carbon black concentration on photocuring time and optical density is given in Table II. From the results of that data it is seen that photocuring time and optical density increase with carbon black concentration.

TABLE II[3]

Effect of Black Concentration on Photocuring Time

| | | | | | |
|---|---|---|---|---|---|
| Photocurable Composition C[1,2] | 10 | 10 | 10 | 10 | 10 |
| "Sterling FT"[1] | 0.5 | 1.0 | 2.0 | 2.5 | 5.0 |
| Cure time (minutes) | 1 | 1 | 5–10 | 5–10 | >20 |
| Optical density | ——————→ | | | | |

footnotes:

1. Parts by weight

2. Prepared as in Example 34.

3. The formulation, support, exposure, etc., were as in Example 34.

EXAMPLE 36

The effect of benzophenone concentration upon the photocuring time of photocurable compositions containing carbon black is given in Table III. From the results of that data it is shown that the photocuring time for photocurable compositions containing pigments or dyes can be reduced by increasing the quantity of the photocuring accelerator in the photocurable composition.

TABLE III[3]

Effect of Benzophenone Concentration on Photocuring Time

| | | | | |
|---|---|---|---|---|
| Photocurable Composition C[1,2] | 10 | 10 | 10 | 10 |
| "Sterling FT" | 2.5 | 2.5 | 2.5 | 2.5 |
| Additional benzophenone | 0.5 | 1.0 | 3 | 5 |
| Photocuring Time (minutes) | 5–10 | 5–10 | 5 | 3 |

footnotes:

1. Parts by weight.

2. Prepared as in Example 34.

3. The formulation, support, exposure, etc., were as in Example 34.

EXAMPLE 37

Various pigments were placed in photocurable composition C. The formulation, containing extra benzophenone, was formulated, placed on a support, exposed, etc., as in Example 34. The compositions and results are shown in Table IV.

EXAMPLE 38

The silverless photographic negative prepared as in Example 3 was used successfully to prepare the following articles; (a) a letterpress printing plate (20-mils image relief) and a lithographic printing plate (0.5-mils image relief) according to the process described in copending application No. 674,773, filed Oct. 12, 1967 now abandoned, (b) a photoengraving on metallic zinc using conventional photoresists and the powderless etching technique (35-mils image relief) as used by photoengravers in the preparation of engravings for conversion to flexographic printing plates and (c) a conventional silk screen element which after exposure and washout was useful for printing by the screen-process printing method. The negative prepared in Example 3 was also used in an overhead projector to project an image.

What is claimed is:

1. A process for image reproduction from a layer of a uniform mixture of a photocurable composition consisting essentially of 2 to 98 parts by weight of said composition of an ethylenically unsaturated polyene containing at least two reactive unsaturated carbon to carbon bonds per molecule, 98 to 2 parts by weight of said composition of a polythiol containing at least two thiol groups per molecule, the total combined functionality of (a) the reactive unsaturated carbon-to-carbon bonds per molecule in the polyene and (b) the thiol groups per molecule in the polythiol being greater than 4, 0.0005 to 50 parts by weight of said composition of a photocuring rate accelerator and black, white or colored fillers, pigments or dyes being present in an amount ranging from 0.1 to 200 parts per 100 parts of said photocurable composition, said photocurable composition being laminated between a cover layer and a support layer, at least one of said cover or support layer being essentially transparent, said composition adhering more strongly to one layer in its exposed state and to the other layer in its exposed state, said process consisting of the steps of (1) exposing said photocurable composition imagewise through a stencil, halftone or line, negative or positive transparency to actinic radiation through said essentially transparent support or cover layer whereby the exposed areas of the photocurable composition are converted to an insoluble, hardened cured state, (2) separating said support layer and said cover layer thereby obtaining a positive and negative reproduction of said image and (3) thereafter exposing the unexposed areas of the photocurable composition directly to actinic radiation to form a cured photocured positive and negative easily readable reproduction of said image.

2. A process as described in claim 1 wherein said cover layer is transparent.

3. A process as described in claim 1 wherein said cover layer comprises of a solid synthetic polymeric sheet.

4. A process as described in claim 1 wherein said cover layer is comprised of an essentially transparent solid synthetic polymeric sheet having a matte finish on at least one side thereof.

5. A process as described in claim 1 wherein said support layer comprises a solid synthetic polymeric sheet.

6. A process as described in claim 1 wherein said support layer is comprised of a solid synthetic polymeric sheet having a matte finish.

7. A process as described in claim 1 wherein said support layer comprises a fibrous sheet.

TABLE IV

[Use of dyestuffs in the photocurable composition]

| | | | | | | | | | | |
|---|---|---|---|---|---|---|---|---|---|---|
| Photocurable composition C[1,2] | 10 | 10 | 10 | 10 | 10 | 10 | 10 | 10 | 10 | 10 |
| "Standard ultramarine"[1,3] Blue 3717 | 0.5 | 1.0 | 2.0 | 5.0 | | | | | | |
| "Azosol Black MA"[1,4] | | | | | 0.5 | 1.0 | | | | |
| "Nigrosine SSB"[1,5] | | | | | | | 0.5 | 1.0 | | |
| "Ranger Red"[1,6] | | | | | | | | | 0.5 | 1.0 |
| Additional benzophenone[1] | 0.5 | 0.5 | 0.5 | 0.5 | 0.5 | 0.5 | 0.5 | 0.5 | 0.5 | 0.5 |
| Photocuring time (minutes) | 1 | 1 | 1 | 1 | 5 | 5 | 10 | 10 | 5 | 5 |
| Color | Pale blue | | Dark blue | | Light gray | | Light gray | | Pale red | |

[1] Parts by weight.
[2] Prepared as in Example 34.
[3] Commercially available from Standard Ultramarine Co.
[4] Commercially available from General Aniline & Film Corporation.
[5] Commercially available from General Aniline & Film Corporation.
[6] Commercially available from Standard Ultramarine Co.

8. A process as described in claim 1 wherein said support layer comprises a glass sheet.

9. A process as described in claim 1 wherein the thickness of the photocurable layer ranges between about 0.01 mil and about 4 mils.

10. A process as described in claim 1 wherein the image areas of the separated positive and negative reproductions are rendered more easily visible and readable by a surface application to said image areas of at least one member of the group consisting of fillers, pigments and dyes, said members being black, white, transparent or colored.

11. A process as described in claim 1 wherein said polyene composition has a molecular weight on the range of about 50 to about 20,000; has a viscosity ranging from 0 to 20,000,000 centipoises at 70° C., and has the general formula: $[A]-(X)_m$, wherein X is a member of the group consisting of $$\mathrm{R-\overset{R}{\overset{|}{C}}=\overset{R}{\overset{|}{C}}-}$$

and R-C ≡ C-; *m* is an integer of at least two; R is independently selected from the group consisting of hydrogen, halogen, aryl, substituted aryl, aralkyl, substituted aralkyl, cycloalkyl, substituted cycloalkyl, alkyl and substituted alkyl groups containing 1 to 6 carbon atoms; and A is a polyvalent polymeric organic moiety free of reactive carbon to carbon unsaturation.

12. A process as described in claim 1 wherein A also has unsaturated groupings in terminal conjugation with X.

13. A process as described in claim 1 wherein the two, or more, reactive unsaturated carbon to carbon bonds per molecule are located at the ends of or pendant from the main chain of the molecule.

14. A process as described in claim 1 wherein the two, or more, reactive unsaturated carbon to carbon bonds per molecule are located within the main chain of the molecule.

15. A process as described in claim 1 wherein the two, or more, reactive unsaturated carbon to carbon bonds per molecule are conjugated with another unsaturated group.

16. A process as described in claim 1 wherein only the exposed areas of the photocurable layer adhered to the cover layer.

17. A process as described in claim 1 wherein only the exposed areas of the photocurable layer adhered to the support layer.

18. The positive and negative reproductions produced by the process of claim 1.

19. A photocurable element having (1) a support layer, (2) a layer of a uniform mixture of a photocurable composition consisting essentially of 2 to 98 parts by weight of said composition of an ethylenically unsaturated polyene containing at least two reactive unsaturated carbon to carbon bonds per molecule, 98 to 2 parts by weight of said composition of a polythiol containing at least two thiol groups per molecule, the total combined functionality of (a) the reactive unsaturated carbon to carbon bonds per molecule in the polyene and (b) the thiol groups per molecule in the polythiol being greater than 4, 0.0005 to 50 parts by weight of said composition of a photocuring rate accelerator, and black, white or colored fillers, pigments or dyes and being present in an amount ranging from 0.1 to 200 parts per 100 parts of said photocurable composition, and (3) a cover layer, wherein either the cover layer or support layer or both is essentially transparent.

20. A photocurable element as described in claim 19 wherein said cover layer is a solid synthetic polymeric sheet.

21. A photocurable element as described in claim 19 wherein said cover layer is comprised essentially of a transparent solid synthetic polymeric sheet having a matte finish on at least one side thereof.

22. A photocurable element as described in claim 19 wherein said support layer comprises a solid synthetic polymeric sheet.

23. A photocurable element as described in claim 19 wherein said support layer is comprised of a solid synthetic polymeric sheet having a matte finish on at least one side thereof.

24. A photocurable element as described in claim 19 wherein said support layer is a fibrous sheet.

25. A photocurable element as described in claim 19 wherein said support layer is a glass sheet.

26. A photocurable element as described in claim 19 wherein the thickness of the photocurable layer ranges between about 0.01 mil and about 4 mils.

27. A photocurable element as described in claim 19 wherein said polyene composition has a molecular weight in the range of about 50 to about 20,000; has a viscosity ranging from 0 to 20,000,000 centipoises at 70° C., and has the general formula: $[A]-(X)_m$, wherein X is a member of the group consisting of $$\mathrm{R-\overset{R}{\overset{|}{C}}=\overset{R}{\overset{|}{C}}}$$

and R-C ≡ C—; *m* is an integer of at least two; R is independently selected from the group consisting of hydrogen, halogen, aryl, substituted aryl, aralkyl, substituted aralkyl, cycloalkyl, substituted cycloalkyl, alkyl and substituted alkyl groups containing 1 to 16 carbon atoms; and A is a polyvalent polymeric organic moiety free of reactive carbon to carbon unsaturation.

28. A photocurable element as described in claim 19 wherein A also has unsaturated groupings in terminal conjugation with X.

29. A photocurable element as described in claim 19 wherein the two, or more, reactive unsaturated carbon to carbon bonds per molecule are located at the ends of or pendant from the main chain of the molecule.

30. A photocurable element as described in claim 19 wherein the two, or more, reactive unsaturated carbon to carbon bonds per molecule are located at the ends of or pendant from the main chain of the molecule.

31. A photocurable element as described in claim 19 wherein the two, or more, reactive unsaturated carbon to carbon bonds per molecule are located within the main chain of the molecule.

32. A photocurable element as described in claim 19 wherein the two, or more, reactive unsaturated carbon to carbon bonds per molecule are conjugated with another unsaturated group.

* * * * *

PO-1050
(5/69)

UNITED STATES PATENT OFFICE
CERTIFICATE OF CORRECTION

Patent No. 3,645,730 Dated February 29, 1972

Inventor(s) Victor S. Frank and Donald P. Gush

It is certified that error appears in the above-identified patent and that said Letters Patent are hereby corrected as shown below:

Claim 11, column 23, line 10, delete the numeral "6" and add the numeral -16-.

Signed and sealed this 13th day of June 1972.

(SEAL)
Attest:

EDWARD M.FLETCHER,JR.
Attesting Officer

ROBERT GOTTSCHALK
Commissioner of Patents